(12) United States Patent
Nelhiebel et al.

(10) Patent No.: US 11,276,624 B2
(45) Date of Patent: Mar. 15, 2022

(54) SEMICONDUCTOR DEVICE POWER METALLIZATION LAYER WITH STRESS-RELIEVING HEAT SINK STRUCTURE

(71) Applicant: Infineon Technologies Austria AG, Villach (AT)

(72) Inventors: Michael Nelhiebel, Villach (AT); Heiko Assmann, Dresden (DE); Olaf Heitzsch, Coswig (DE); Jakob Kriz, Weinboehla (DE); Sven Lanzerstorfer, Feldkirchen (AT); Rainer Pelzer, Wernberg (AT); Werner Robl, Regensburg (DE); Bernhard Weidgans, Bernhardswald (DE); Johannes Zechner, Schiefling (AT)

(73) Assignee: Infineon Technologies Austria AG, Villach (AT)

( * ) Notice: Subject to any disclaimer, the term of this patent is extended or adjusted under 35 U.S.C. 154(b) by 91 days.

(21) Appl. No.: 16/716,789

(22) Filed: Dec. 17, 2019

(65) Prior Publication Data

US 2021/0183732 A1 Jun. 17, 2021

(51) Int. Cl.
*H01L 23/373* (2006.01)
*H01L 23/367* (2006.01)
*H01L 21/768* (2006.01)

(52) U.S. Cl.
CPC .... *H01L 23/3736* (2013.01); *H01L 21/76816* (2013.01); *H01L 21/76846* (2013.01); *H01L 21/76877* (2013.01); *H01L 23/367* (2013.01)

(58) Field of Classification Search
CPC ......... H01L 21/76816; H01L 21/76846; H01L 21/76877; H01L 23/367; H01L 23/3736
See application file for complete search history.

(56) References Cited

U.S. PATENT DOCUMENTS

| 2001/0045270 | A1* | 11/2001 | Bhatti | H01L 23/3737 165/80.3 |
| 2005/0161706 | A1* | 7/2005 | Sutardja | H01L 24/40 257/211 |
| 2007/0009687 | A1* | 1/2007 | Edwards | H01L 23/3732 428/34.1 |
| 2018/0006614 | A1* | 1/2018 | Hoogzaad | H01L 23/3677 |
| 2019/0067154 | A1* | 2/2019 | Yoshihara | H01L 21/56 |

OTHER PUBLICATIONS

Freund, L. B., et al., "Thin Film Materials", Cambridge University Press, 2003, pp. 190-193.

* cited by examiner

*Primary Examiner* — Allan R Wilson
(74) *Attorney, Agent, or Firm* — Murphy, Bilak & Homiller, PLLC

(57) ABSTRACT

A semiconductor device includes: a semiconductor substrate; a power device formed in the semiconductor substrate; a metal bilayer formed over the semiconductor substrate, the metal bilayer including a discontinuous metal layer formed on and in contact with a continuous base metal layer; and one or more contact pads formed in the metal bilayer or in a metallization layer above the metal bilayer. The discontinuous metal layer includes a plurality of metal blocks which are laterally spaced apart from one another and which form a heat sink structure over the power device. The continuous base metal layer is configured to laterally spread heat energy from the power device to the plurality of metal blocks. Methods of producing the semiconductor device are also described.

13 Claims, 9 Drawing Sheets

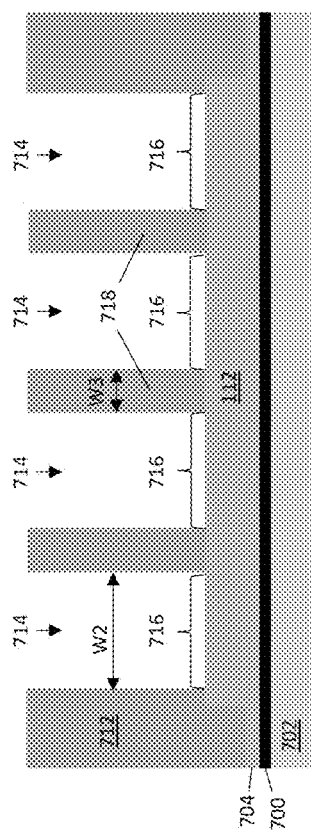
Figure 7E
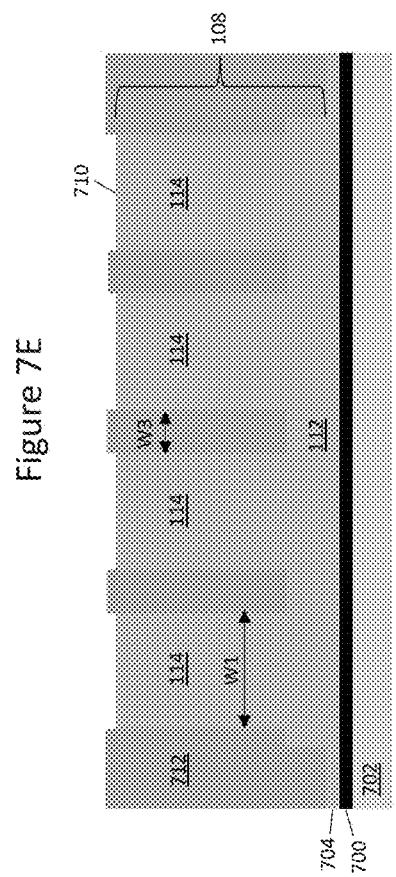
Figure 7F
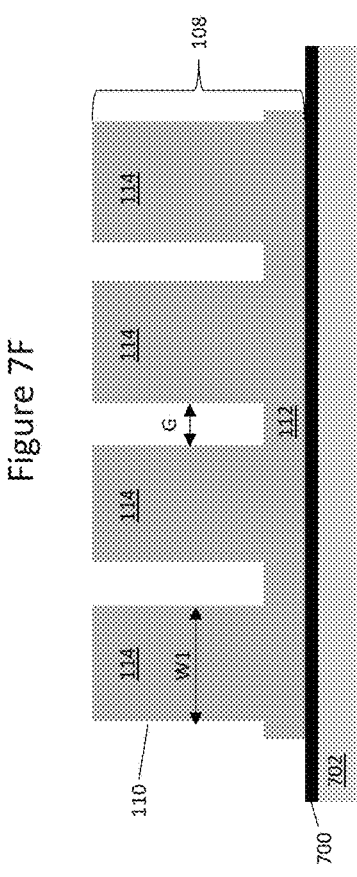
Figure 7G
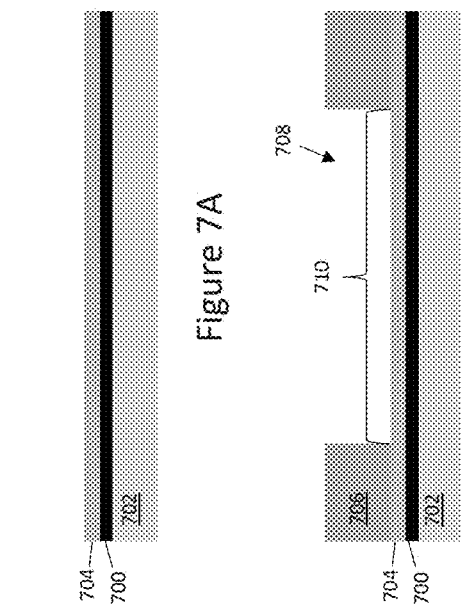
Figure 7A
Figure 7B
Figure 7C
Figure 7D

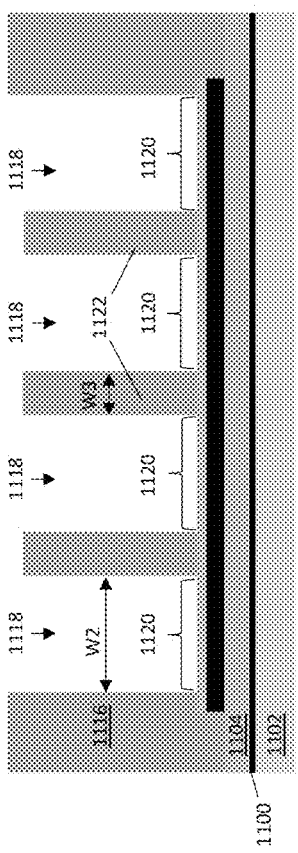
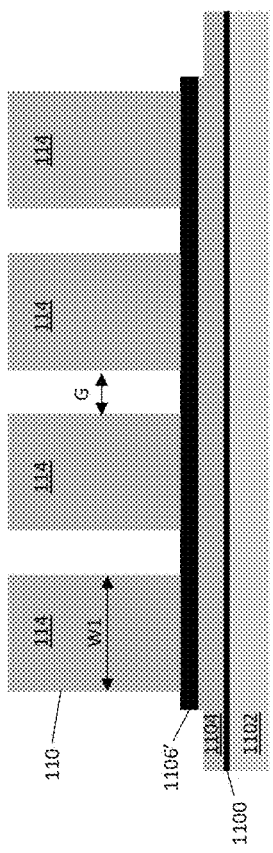
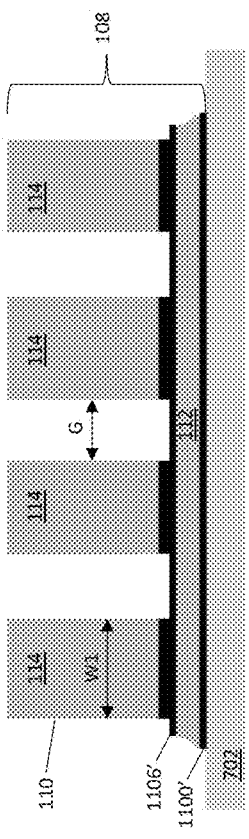
Figure 11E
Figure 11F
Figure 11G
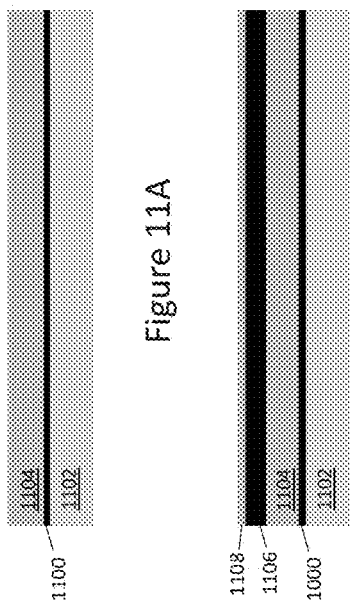
Figure 11A
Figure 11B
Figure 11C
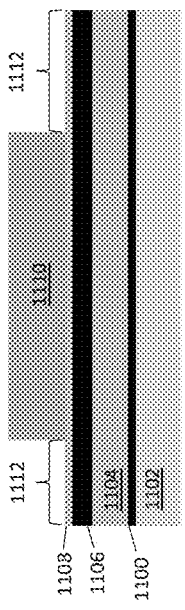
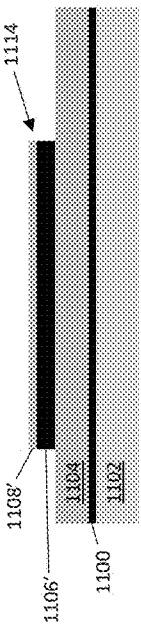
Figure 11D

SEMICONDUCTOR DEVICE POWER METALLIZATION LAYER WITH STRESS-RELIEVING HEAT SINK STRUCTURE

BACKGROUND

Some power semiconductor devices such as IGBTs (insulated gate bipolar transistors), power MOSFETs (metal-oxide-semiconductor field-effect transistors), etc. use ultra-thick (e.g. 20 μm thick or greater) copper metallization to optimize electro-thermal device behavior. Such thick copper metal layers directly on top of a device provide superior heat capacity, enabling a factor (2×) increase in energy-density capability, and corresponding area reduction, during short transient electrical overload events. Furthermore, such thick copper metal layers have very low lateral resistance with correspondingly good current spreading, and high mechanical strength which enables thick-copper-wire bonding.

However, a large mismatch in thermal expansion between copper and silicon induces a severe mismatch-strain in the copper film, which translates into film stress and subsequently wafer- or chip (die) bow, every time a significant temperature change occurs. The bow effect becomes more severe as films grow thicker, since the forces and bending moments exerted by the film are proportional to the product of film-stress and film-thickness.

This problem necessarily occurs during wafer- and chip processing after each process step which involves high (>100° C.) temperatures, but also during field use of the devices where temperature swings of more than 100° C. (and up to 400° C. or more) by electric power dissipation must be addressed.

Both in front-end and back-end production, wafer- and chip bow poses severe constraints, necessitating expensive additional process measures such as glass-carrier processes, specific adaptions of chucks and handling robots to high-bow wafers, engineering support, etc. or even forgoing certain products and layouts having too much copper coverage. Also, cracks in the ILD (interlayer dielectric) and silicon layers underneath edges of thick copper films may occur as a result of film stress.

During switching usage of a power device with a thick copper film, the repetitive cyclic stresses induced in the copper film cause fatigue degradation of the film. Such fatigue degradation eventually induces failure of the device over time, and effectively blocks further area shrinks that would go along with an increase in temperature.

Thus, there is a need for a power metallization layer having high thickness for good electro-thermal performance, and still leading to reduced bow during production and high fatigue robustness in the field.

SUMMARY

According to an embodiment of a semiconductor device, the semiconductor device comprises: a semiconductor substrate; a power device formed in the semiconductor substrate; a metal bilayer formed over the semiconductor substrate, the metal bilayer comprising a discontinuous metal layer formed on and in contact with a continuous base metal layer; and one or more contact pads formed in the metal bilayer or in a metallization layer above the metal bilayer, wherein the discontinuous metal layer comprises a plurality of metal blocks which are laterally spaced apart from one another and which form a heat sink structure over the power device, wherein the continuous base metal layer is configured to laterally spread heat energy from the power device to the plurality of metal blocks.

According to another embodiment of a semiconductor device, the semiconductor device comprises: a semiconductor substrate; and a metal bilayer separated from the semiconductor substrate by at least one interlayer dielectric, the metal bilayer comprising a discontinuous metal layer on a continuous base metal layer, wherein the continuous base metal layer has a thickness which is at most 20% of an overall thickness of the metal bilayer, wherein the discontinuous metal layer has a thickness which is at least 50% of the overall thickness of the metal bilayer, wherein the discontinuous metal layer comprises a plurality of metal blocks which are laterally spaced apart from one another and in contact with the continuous base metal layer, wherein the plurality of metal blocks each have a width greater than the thickness of the discontinuous metal layer, wherein a gap between adjacent metal blocks of the plurality of metal blocks is less than both the width of the plurality of metal blocks and the thickness of the discontinuous metal layer.

According to an embodiment of a method of producing a semiconductor device, the method comprises: forming a metal bilayer over a semiconductor wafer; and forming one or more contact pads in the metal bilayer or in a metallization layer above the metal bilayer, wherein forming the metal bilayer comprises: forming a continuous base metal layer over an interlayer dielectric; forming a first patterned photoresist on the continuous base metal layer, the first patterned photoresist having a plurality of openings separated from one another by respective walls; and filling the plurality of openings in the first patterned photoresist with metal or a metal alloy to form a discontinuous metal layer which is in contact with the continuous base metal layer and comprises a plurality of metal blocks laterally spaced apart from one another by the walls of the first patterned photoresist.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 7A through 7G illustrate respective partial cross-sectional views during different stages of a method for producing the metal bilayer.

FIGS. 11A through 11G illustrate respective partial cross-sectional views during different stages of another embodiment of a method for producing the metal bilayer.

DETAILED DESCRIPTION

The embodiments described herein provide a metal bilayer for a semiconductor device. The metal bilayer comprises a discontinuous metal layer formed on and in contact with a continuous base metal layer. The discontinuous metal layer comprises a plurality of metal blocks which are laterally spaced apart from one another and which form a heat sink structure over a power device. The continuous base metal layer is configured to laterally spread heat energy from the power device to the plurality of metal blocks. The discontinuous metal layer is configured to dissipate heat energy generated by the power device.

By dividing the overall thickness of the metal bilayer between the discontinuous metal layer and the underlying continuous base metal layer, the continuous base metal layer may be made thin enough to limit the amount of stress exerted by the metal bilayer during temperature excursions. A metal film with intrinsic stress can exert forces and moments on a substrate to which the metal film is attached only if the metal film is continuous, because stress inside the metal film builds up at a certain distance away from the film-terminating free edges, this distance typically being around 1-4 times the film thickness. According to some embodiments described herein, a thicker heat sink structure formed from laterally separated metal blocks may be monolithically formed on a thinner continuous base metal layer, the thinner continuous base metal layer exerting minimal stress on the underlying substrate due to its relative thinness and the thicker heat sink structure adequately dissipating heat energy generated by the underlying power device without imparting excessive stress due to the laterally segmented/divided nature of the heat sink structure. According to other embodiments, the underlying continuous base metal layer of the metal bilayer instead may be thicker than the segmented heat sink structure of the metal bilayer to provide a relatively thick base layer for lateral current spreading and a comparatively thin slotted heat buffer. Described next are various embodiments of the metal bilayer and methods of producing the metal bilayer.

Figure 1:
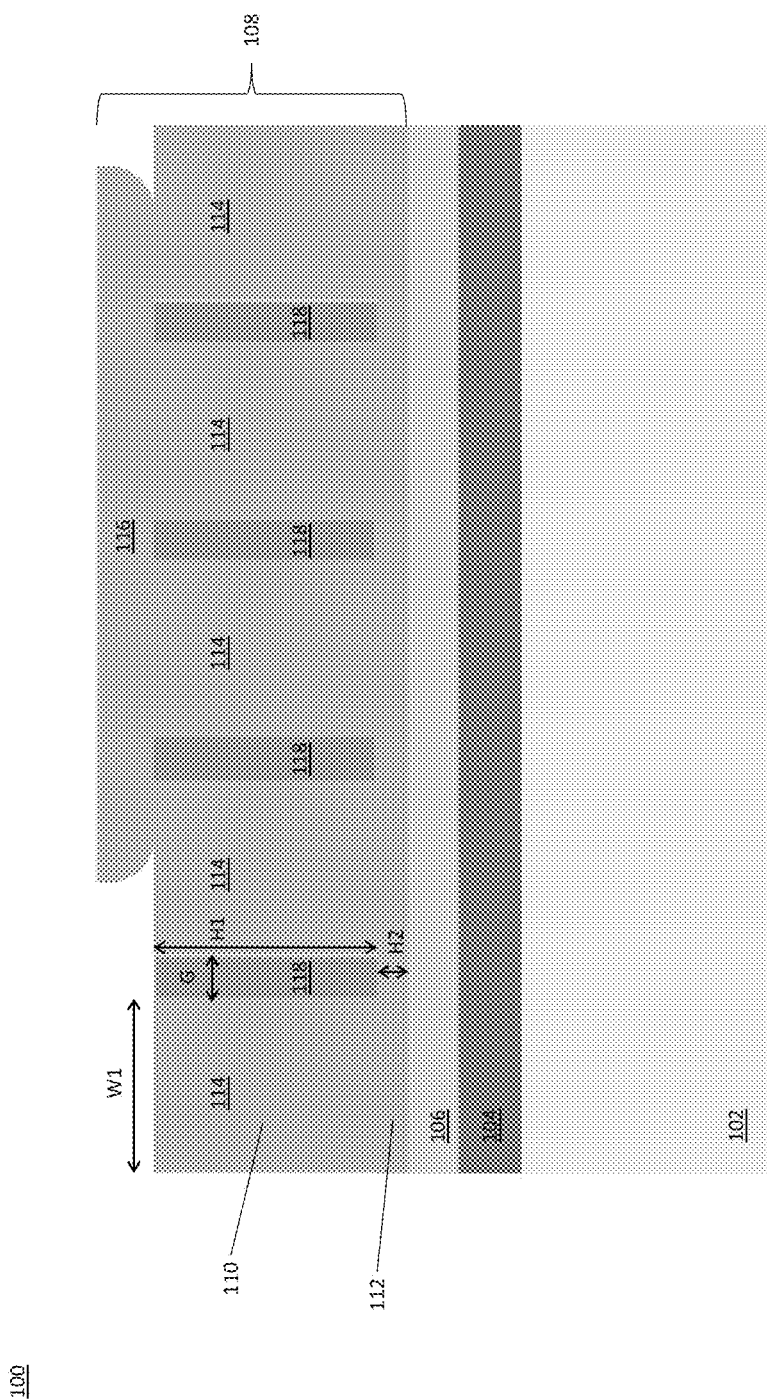
FIG. 1 illustrates a partial cross-sectional view of an embodiment of a semiconductor device having a semiconductor substrate, a power device formed in the semiconductor substrate and a metal bilayer for dissipating heat generated by the power device.

FIG. 1 illustrates a partial cross-sectional view of an embodiment of a semiconductor device 100 that includes a semiconductor substrate 102 and a power device formed in the semiconductor substrate 102. In general, the semiconductor substrate 102 may be formed from a wide variety of semiconductor materials including group IV semiconductor materials such as silicon (Si), silicon carbide (SiC) or silicon germanium (SiGe), group III-V semiconductor materials such as gallium nitride (GaN), gallium arsenide (GaAs), aluminium nitride (AlN), aluminium arsenide (AlAs), indium nitride (InN), indium arsenide (InAs), ternary or quarternary type III-V semiconductor materials such as aluminium gallium nitride (AlGaN), aluminium gallium arsenide (AlGaAs), indium gallium nitride (InGaN), indium aluminium gallium nitride (InAlGaN), etc. The semiconductor substrate 102 may include a base semiconductor body such as a bulk semiconductor wafer prior to singulation or a slice of a bulk semiconductor wafer post singulation. One or more epitaxial layers may be formed on the base semiconductor body.

The power device formed in the semiconductor substrate 102 may be any type of power semiconductor device such a power diode, a power transistor, etc. For example, in the case of a power transistor, the power semiconductor device may be an IGBT, a power MOSFET, a HEMT (high-electron mobility transistor), etc. Additional circuitry such as gate drivers, level shifters, controller, etc. may be integrated in the same semiconductor substrate 102 as the power device. In each case, the power device includes a heat generating region 104 from which a significant portion of all heat energy generated by the power device originates. For example, the heat generating region 104 may include trenches with gate electrodes and doped regions of a power transistor such as source, body and drift regions. The primary current path of the power device traverses the heat generating region 104.

A back-end structure 106 is formed on the semiconductor substrate 102. The back-end structure 106 may include one or more pre-metal dielectrics such as PSG (phosphosilicate glass), BPSG (borophosphosilicate glass), etc., one or more inter-metal dielectrics such as USG (undoped silicate glass), FSG (fluorosilicate glass), etc., one or more metal layers separated from one another by the one or more inter-metal dielectrics, and one or more via layers formed in the one or more inter-metal dielectrics for vertically electrically connecting the one or more metal layers.

The semiconductor device 100 also includes a metal bilayer 108 formed over the semiconductor substrate 102. The metal bilayer 108 includes a discontinuous metal layer 110 formed on and in contact with a continuous base metal layer 112. The discontinuous metal layer 110 includes a plurality of metal blocks 114 which are laterally spaced apart from one another by a gap 'G' and which form a heat sink structure over the heat generating region 104 of the power device. The heat sink structure formed in the discontinuous metal layer 110 adequately dissipates heat energy generated by the underlying power device without imparting excessive stress on the semiconductor substrate 102 due to the gap G between the metal blocks 114 of the heat sink structure. The underlying continuous base metal layer 112 laterally spreads heat energy from the power device to the metal blocks 114 of the heat sink structure. In the case of the continuous base metal layer 112 being relatively thin compared to the discontinuous metal layer 110, the base metal layer 112 exerts minimal stress on the underlying semiconductor substrate 102 even though the base metal layer 112 is continuous. The metal bilayer 108 thus mitigates the bow and fatigue problems described in the background section, without sacrificing metal coverage and therefore providing adequate thermal performance for the semiconductor device 100.

In one embodiment, the thickness H1 of the discontinuous metal layer 110 of the metal bilayer 108 is relatively large, e.g., 10 μm, 15 μm, 20 μm or more compared to the thickness H2 of the continuous base metal layer 112, to ensure good cooling efficiency. In this case, the continuous base metal layer 112 of the metal bilayer 108 may be thick enough to ensure lateral heat spreading but as thin as possible to minimize edge/interface interactions. In another embodiment, the thickness H1 of the discontinuous metal layer 110 of the metal bilayer 108 is less than the thickness H2 of the continuous base metal layer 112. For example, a particular power device may require a thermal capacity provided by 20 µm thick metal and an electric conductivity provided by 15 µm thick metal. In this specific example, the thickness H2 of the continuous base metal layer 112 may be in a range of 12 to 14 µm whereas the thickness H1 of the discontinuous metal layer 110 may be in a range of 8 to 10 µm. Other thickness ranges and relationships may be implemented by choosing the thickness H1 of the discontinuous metal layer 110 and the thickness H2 of the continuous base metal layer 112 appropriately. In general, the ratio H1:H2 is preferably in the range of 1:2 (discontinuous metal layer 110 is half as thick as continuous base metal layer 112) to 50:1 (discontinuous metal layer 110 is 50 times as thick as continuous base metal layer 112).

The width W1 of the metal blocks 114 of the heat sink structure formed in the discontinuous metal layer 110 may be small as thermally possible to prevent stress build-up in the discontinuous metal layer 110. The gap 'G' between adjacent metal blocks 114 which form the heat sink structure in the discontinuous metal layer 110 may be as small as processing limits permit to yield as much thick metal area over the power device as possible. Described next are various embodiments of height, width, spacing and material relationships for the metal bilayer 108.

In one embodiment, the semiconductor substrate 102 comprises Si and has a thickness H3 of 120 µm (microns) or more or less, the discontinuous metal layer 110 of the metal bilayer has a thickness H1 of 10 µm to 20 µm or more, the metal blocks 114 of the heat sink structure formed in the discontinuous metal layer 110 have a periodic lateral spacing 'G' of about 20 µm to 10 µm or less, e.g., 6 µm to 8 µm, the continuous base metal layer 112 of the metal bilayer 108 has a thickness H2 of about 2 µm, e.g., 2 µm to 3 µm, and the metal blocks 114 have a width W1 of 60 µm to 30 µm or less. Simulation results show that bow-reduction is reduced by disrupting the discontinuous metal layer 110 of the metal bilayer 108. Simulation results also show that for the same reason of incomplete stress build up within the metal blocks 114 of the heat sink structure formed in the discontinuous metal layer 110, the degradation of the metal bilayer 108 and its interfaces by thermal mismatch strain is drastically reduced. For example, patterned Cu blocks 114 having a 37 µm to 47 µm pitch (30 µm to 40 µm width W1; 7 µm spacing 'G') reduce bowing by a factor of at least 2, normalized to 20 µm Cu film bow. At the same time, the main use and benefit of thick metal films such as copper (Cu) films is their capability of taking up heat from the power device and thereby buffering short overload events, in which case the heat flow is exclusively vertical and would not be hindered by vertical cracks. Hence, by using the metal bilayer 108 described herein with the discontinuous metal layer 110 formed on and in contact with the continuous base metal layer 112, the main advantage of thick copper is maintained while also significantly reducing bow and thermo-mechanical degradation.

Separately or in combination, the thickness H1 of the discontinuous metal layer 110 of the metal bilayer 108 may be greater than the thickness H2 of the continuous base metal layer 112 of the metal bilayer 108 and the metal blocks 114 which form the heat sink structure in the discontinuous metal layer 110 may each have a width W1 greater than the thickness H2 of the discontinuous metal layer 112.

Separately or in combination, the thickness H1 of the discontinuous metal layer 110 of the metal bilayer 108 may be at least 10 times the thickness H2 of the continuous base metal layer 112 of the metal bilayer 108 and the metal blocks 114 which form the heat sink structure in the discontinuous metal layer 110 may each have a width W1 greater than the thickness H2 of the discontinuous metal layer 112.

Separately or in combination, the discontinuous metal layer 110 of the metal bilayer 108 may comprise copper and have a thickness H1 greater than 10 µm, the continuous base metal layer 112 of the metal bilayer 108 may also comprise copper and have a thickness H2 less than 10 µm, and the metal blocks 114 which form the heat sink structure in the discontinuous metal layer 110 may each have a width W1 greater than the thickness H2 of the discontinuous metal layer 112.

Separately or in combination, the gap 'G' between adjacent metal blocks 114 which form the heat sink structure in the discontinuous metal layer 110 of the metal bilayer 108 may be less than both the width W1 of the metal blocks 114 and the thickness H2 of the discontinuous metal layer 112 of the metal bilayer 108.

Separately or in combination, the gap 'G' between adjacent metal blocks 114 which form the heat sink structure in the discontinuous metal layer 110 may be less than one third (⅓) the width W1 of the metal blocks 114 and less than one half (½) the thickness H2 of the discontinuous metal layer 112 of the metal bilayer 108.

Separately or in combination, the gap 'G' between adjacent metal blocks 114 which form the heat sink structure in the discontinuous metal layer 110 may be less than one quarter (¼) the width W1 of the metal blocks 114.

Separately or in combination, the thickness H1 of the discontinuous metal layer of the metal bilayer 108 may be greater than 20 µm, the thickness H2 of the continuous base metal layer of the metal bilayer 108 may be in a range of 1 µm to 6 µm, the metal blocks 114 which form the heat sink structure in the discontinuous metal layer 110 may each have a width W1 in a range of 30 µm to 60 µm, and the gap 'G' between adjacent ones of the metal blocks 114 may be in a range of 1 µm to 10 µm.

Separately or in combination, the thickness H2 of the continuous base metal layer 112 of the metal bilayer 1078 may be at most 20% of the overall thickness (H1+H2) of the metal bilayer 108, the thickness H1 of the discontinuous metal layer 110 of the metal bilayer 108 may be at least 50% of the overall thickness (H1+H2) of the metal bilayer 108, the metal blocks 114 which form the heat sink structure in the discontinuous metal layer 110 may each have a width W1 greater than the thickness H1 of the discontinuous metal layer 110, and the gap 'G' between adjacent ones of the metal blocks 114 may be less than both the width W1 of the metal blocks 114 and the thickness H1 of the discontinuous metal layer 110.

Still other height, width, spacing and material relationships may be implemented and fall within the scope of the metal bilayer embodiments described herein.

As shown in FIG. 1, the semiconductor device 100 may also include one or more contact pads 116 formed in the metal bilayer 108. The contact pads 116 provide points of external electrical connection for the semiconductor device 100, e.g., via wire bonds, metal ribbons, metal clips, solder balls, Cu pillars, etc. According to the embodiment shown in FIG. 1, the metal bilayer 108 is the uppermost metallization layer of the semiconductor device 100. Since the metal bilayer 108 is the uppermost metallization layer of the semiconductor device 100 in FIG. 1, the gap 'G' between adjacent metal blocks 114 which form the heat sink structure in the discontinuous metal layer 110 of the metal bilayer 108 may be filled with an encapsulation material 118 such a molding compound, imide, spin on glass, or a phase-change material like paraffin, etc., thereby adding additional heat capacity to the metallization stack.

Figure 2:
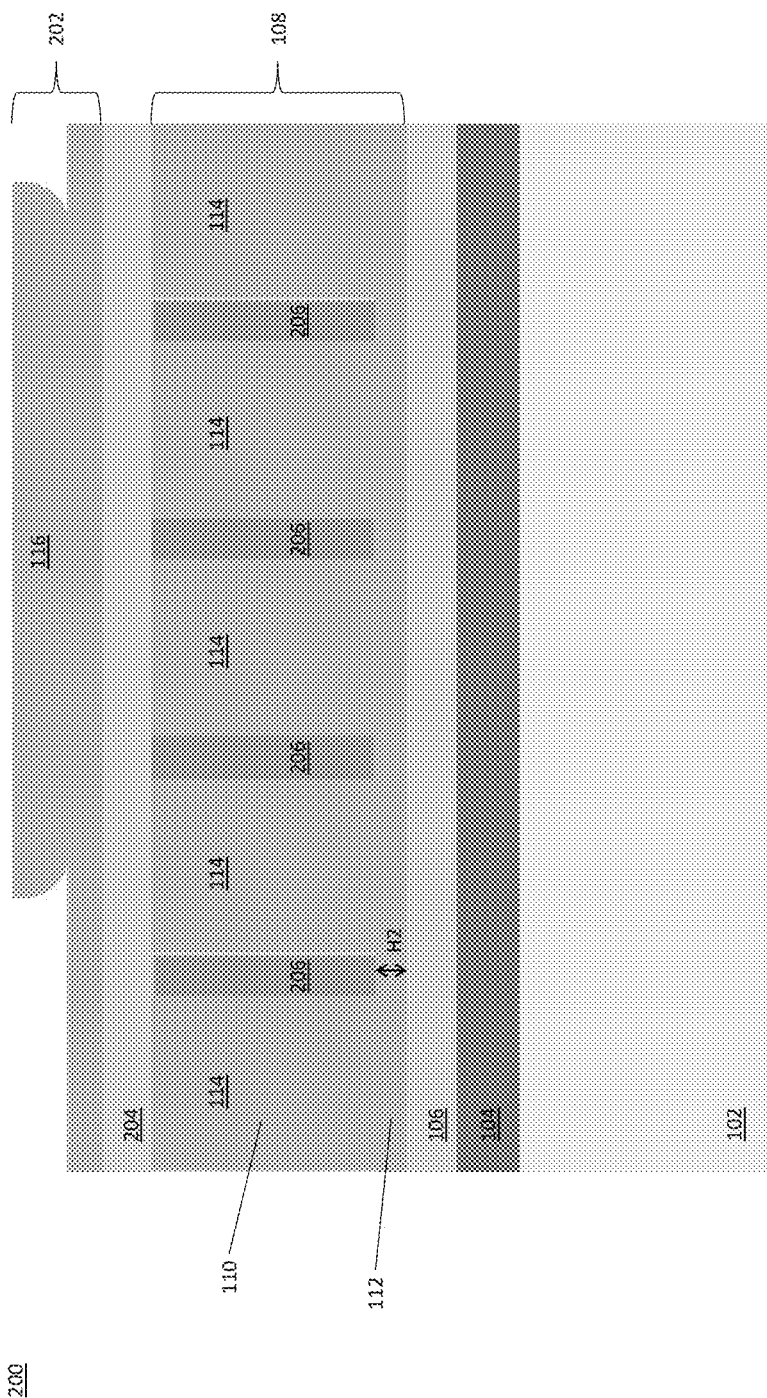
FIG. 2 illustrates a partial cross-sectional view of another embodiment of a semiconductor device having a semiconductor substrate, a power device formed in the semiconductor substrate and a metal bilayer for dissipating heat generated by the power device.

FIG. 2 illustrates a partial cross-sectional view of another embodiment of a semiconductor device 200 that includes the metal bilayer 108. The embodiment shown in FIG. 2 is similar to the embodiment illustrated in FIG. 1. Different, however, the metal bilayer 108 is not the uppermost metallization layer of the semiconductor device 200. Instead, the metal bilayer 108 is an intermediary metal layer. According to the embodiment shown in FIG. 2, the one or more contact pads 116 are formed in a metallization layer 202 above the metal bilayer 108. The uppermost metallization layer 202 and the metal bilayer 108 are separated from one another by one or more ILD layers 204, the number of ILD layers 204 depending on the number of metal layers interposed between the uppermost metallization layer 202 and the metal bilayer 108. The gap 'G' between the adjacent metal blocks 114 which form the heat sink structure in the discontinuous metal layer 110 of the metal bilayer 108 may be filled with a dielectric material 206 such as USG, FSG, etc. or may remain at least partially unfilled 'air' gaps, according to the embodiment illustrated in FIG. 2.

The metal blocks 114 which form the heat sink structure in the discontinuous metal layer 110 of the metal bilayer 108 may be arranged in any desired regular or irregular pattern and may have any desired uniform or nonuniform shape.

Figure 3:
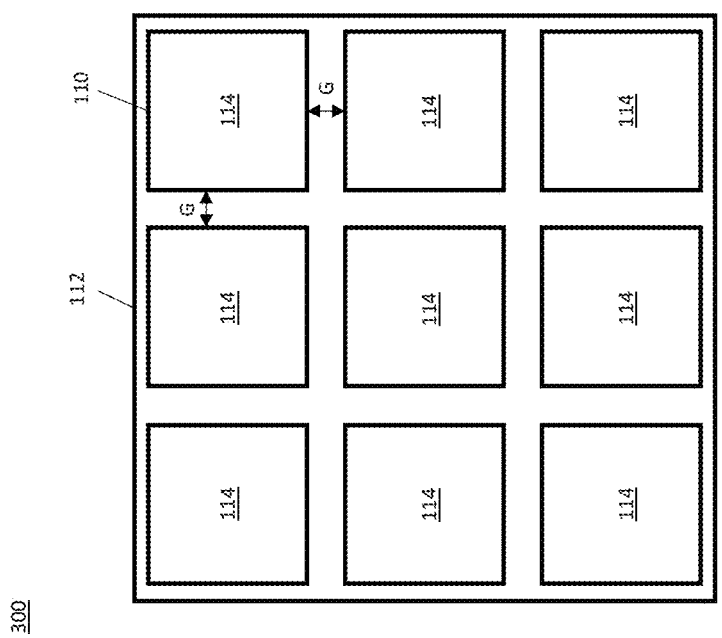

FIG. 3 illustrates an embodiment in which the metal blocks 114 are arranged in a grid 300 of uniformly spaced rows and columns.

Figure 4:
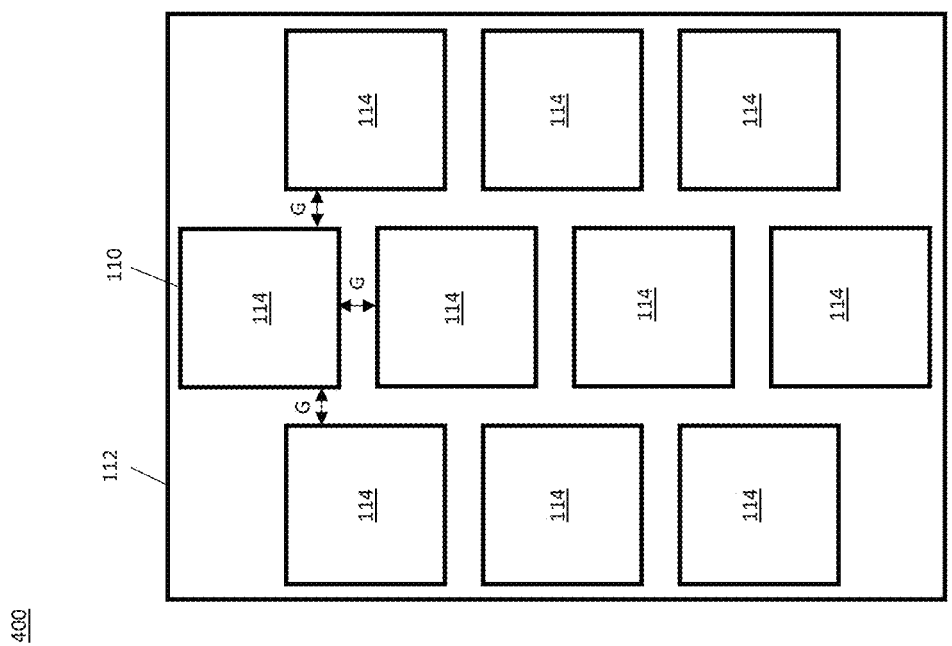
FIGS. 3 through 6 illustrate respective plan views of different layout embodiments for the metal bilayer.

FIG. 4 illustrates an embodiment in which the metal blocks 114 are arranged in a regular pattern 400 of uniformly spaced rows and columns which are offset from one another.

Figure 5:
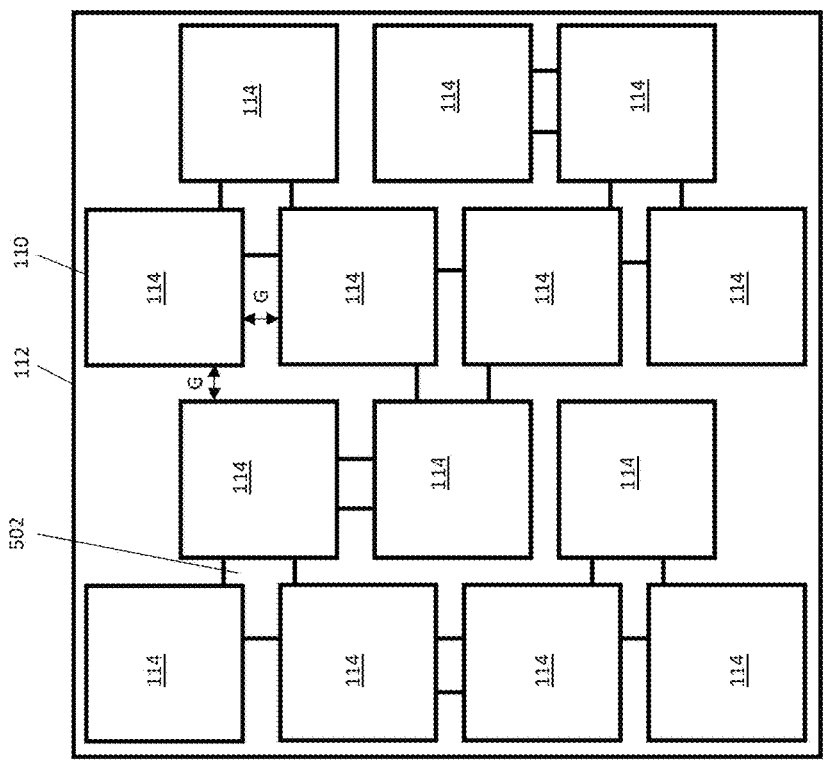

FIG. 5 illustrates an embodiment in which the metal blocks 114 are arranged in a regular pattern 500 which is similar to the pattern 400 illustrated in FIG. 4. Different, however, adjacent metal blocks 114 are connected by bridge sections 502 of the discontinuous metal layer 110 of the metal bilayer 108 in which the metal blocks 114 are formed.

Figure 6:
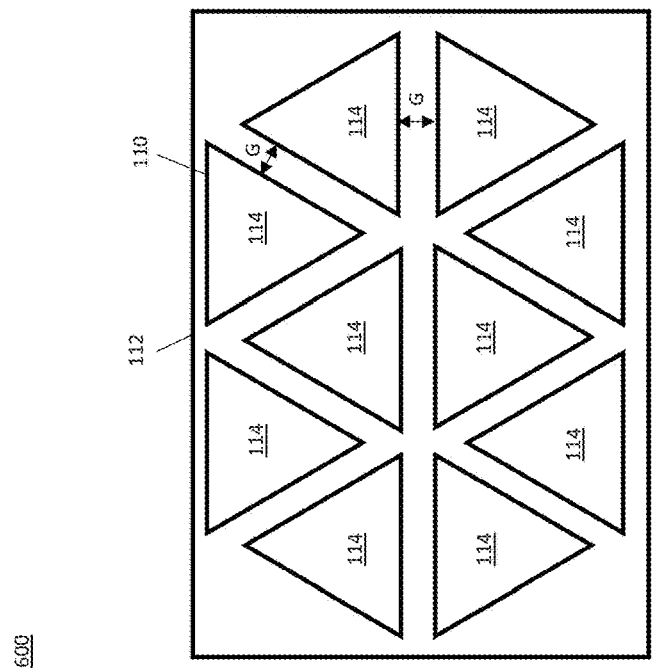

FIG. 6 illustrates an embodiment in which the metal blocks 114 are arranged in a regular pattern 600 of uniformly spaced triangles.

Described next are various embodiments of producing the metal bilayer 108. In each case, the metal bilayer 108 may be the uppermost metallization layer of a semiconductor device or an intermediary metal layer, e.g., as previously described herein.

FIGS. 7A through 7G illustrate respective partial cross-sectional views during different stages of a method for producing the metal bilayer 108.

FIG. 7A shows a Cu diffusion barrier layer 700 such as TiW formed on an ILD 702 and a Cu seed layer 704 formed on the Cu diffusion barrier layer 700.

FIG. 7B shows a first mask 706 such as a photoresist formed on the Cu seed layer 704. The first mask 706 has an opening 708 which exposes a part 710 of the Cu seed layer 704.

FIG. 7C shows the continuous base metal layer 112 of the metal bilayer 108 formed on the exposed part 710 of the Cu seed layer 704 unprotected by the first mask 706. The continuous base metal layer 112 may be formed by a first electrochemical deposition (ECD) process in which Cu is plated on the exposed part 710 of the Cu seed layer 704.

FIG. 7D shows the first mask 706 removed from the Cu seed layer 704.

FIG. 7E shows a second mask 712 such as a photoresist formed on the Cu seed layer 704 and on the continuous base metal layer 112 of the metal bilayer 108. The second mask 712 has openings 714 which expose parts 716 of the continuous base metal layer 112. The width 'W2' of the openings 714 in the second mask 712 defines the width W1 of the metal blocks 114 of the discontinuous metal layer 110 of the metal bilayer 108 to be formed in the openings 714 in the second mask 712. The width/thickness 'W3' of the mask walls 718 defines the size of the gap 'G' between the adjacent metal blocks 114 to be formed.

FIG. 7F shows the discontinuous metal layer 110 of the metal bilayer 108 formed on the exposed parts 716 of the continuous base metal layer 112 of the metal bilayer 108 unprotected by the second mask 712. The discontinuous metal layer 110 may be formed by a second ECD process in which Cu is plated on the exposed parts 716 of the continuous base metal layer 112 to form the metal blocks 114 of the discontinuous metal layer 110. According to the embodiment illustrated in FIGS. 7C and 7F which uses first and second ECD processes, the metal bilayer 108 is monolithically formed with etched structures and resulting in a continuous base layer 112 and a heat sink structure formed by metal blocks 114 in a discontinuous layer 110.

FIG. 7G shows the metal bilayer 108 after removal of the second mask 712 and the part of the Cu seed layer 704 uncovered by the metal bilayer 108. If the metal bilayer 108 is the uppermost metallization layer of the semiconductor device, contact pads may be formed on or as part of the metal bilayer 108, e.g., as previously described herein in connection with FIG. 1. If, however, the metal bilayer 108 is an intermediary metal layer, one or more ILD layers and metal layers may be formed on the metal bilayer 108 to complete the device.

In either case, the discontinuous metal layer 110 of the metal bilayer 108 has metal blocks 114 which are laterally spaced apart from one another by gaps 'G' and which form a heat sink structure. The size of the gaps 'G' between adjacent metal blocks 114 of the discontinuous metal layer 110 is defined by the width/thickness 'W3' of the walls 718 of the second mask 712, as explained above in connection with FIG. 7E. In some cases, the width/thickness 'W3' of the mask walls 718 may be limited to about 30 µm or more depending on the type of photolithography process employed. Such wide gaps, however, may lead to a severe temperature increase in a region of the continuous base metal layer 112 below the gaps 'G' in the discontinuous metal layer 110 during an electrical overload event.

Figure 8:
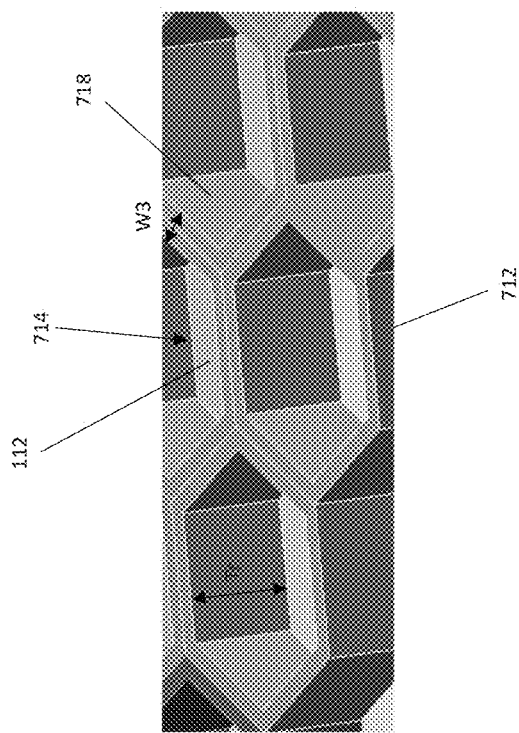
FIG. 8 illustrates a side perspective view of an embodiment of a mask used to defines the size of gaps between adjacent metal blocks in a discontinuous metal layer of the metal bilayer.

FIG. 8 illustrates an embodiment of the second mask 712 which defines the size of the gaps 'G' between adjacent metal blocks 114 in the discontinuous metal layer 110 of the metal bilayer 108. According to this embodiment, narrower mask walls 718 are realized for the second mask 712 by using a photosensitive chemical photoresist that is compatible with galvanic plating processes and which is mechanically stabilized so that the walls 718 of the second mask 712 are physically cross-linked and have a width/thickness 'W3' of 10 µm or less, e.g., 6 µm to 8 µm. A geometric pattern is then transferred from a photomask (not shown) to the photosensitive chemical photoresist to form the second mask 712. The geometric pattern defines the openings 714 and the walls 718 in the photosensitive chemical photoresist.

The geometric pattern also yields physical connections between the walls 718 such that the openings 714 in the photosensitive chemical photoresist are defined on all sides by the walls 718 and the walls 718 support one another during filling of openings 714 with metal or a metal alloy. The thin resist walls 718 are physically stabilized by choosing an appropriate self-sustaining physical cross-link geometry for the resist grid formed by the second mask 712, e.g., a honeycomb structure as shown in FIG. 8. Other types of physical cross-link geometries may be used to support the thin resist walls 718 of the second mask 712.

Physically cross-linking the thin resist walls 718 of the second mask 712 prevents the resist walls 718 from collapsing during the lithography and plating processes shown in FIGS. 7E and 7F. In one embodiment, the photosensitive chemical is a cross-linking negative resist suited for electroplating applications and which allows for resist sidewalls 718 which are very steep up to a film thickness of approximately 10 μm, has a thickness 'Tr' in a range of 5 μm to 20 μm via single-coating, is compatible with aqueous alkaline developers, has excellent adhesion with no underplating, is compatible with many types of metal substrates such as Cu, Au, Ti and NiFe, is compatible with standard plating metals such as Cu, Ni and Au, and may be used with standard wet stripping processes. Other types of photosensitive chemical photoresist materials which allow for high wall height 'Tr' to wall width/thickness 'W3' aspect ratios greater than 1 such as 2:1, 3:1 or greater may also be used for the second mask 712.

Figure 9:
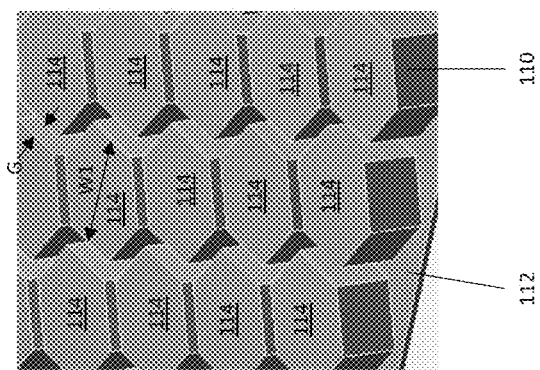
FIG. 9 illustrates a side perspective view of an embodiment of the metal bilayer produced using the mask shown in FIG. 8.

FIG. 9 illustrates an embodiment of the metal bilayer 108 produced using the mask 712 shown in FIG. 8 to form the metal blocks 114 of the discontinuous metal layer 110. According to this embodiment, the size of the gaps 'G' between adjacent metal blocks 114 of the discontinuous metal layer 110 is defined by the width/thickness 'W3' of the walls 718 of the second mask 712 and is 10 μm or less in this embodiment, e.g., 6 μm to 8 μm. For a block width W1 of 20 μm to 40 μm, the gap spacing provided by the mask embodiment of FIG. 8 yields a coverage for the discontinuous metal layer 110 in a range of 50% (for W1=20 μm and W3=10 μm) to 77% (for W1=40 μm and W3=6 μm) with respect to the underlying continuous base metal layer 112. The resulting low-stress, low-fatigue metal bilayer 108 has adequate heat-capacity due to the discontinuous metal layer 110 which is plated into a mechanically-stabilized resist-grid formed by second mask 712 and results in a heat-buffer profile of 20 μm to 40 μm wide copper blocks 114 with 10 μm or less of lateral spacing 'G', on top of a continuous but thin (and therefore little bow inducing) copper base layer 112 which allows for lateral heat spreading. Such a heat sink structure provides adequate thermal capacity while mitigating against bow and cracking issues.

Other gap spacings and width dimensions may be used by adjusting the width 'W2' of the openings 714 in the second mask 712 and the width/thickness 'W3' of the mask walls 718, and may depend on various considerations such as the type of power semiconductor device, electrical overload conditions, etc. In general, the choice of metals and deposition/etching techniques may vary depending on the type of device and application, both for the continuous base metal layer 112 of the metal bilayer 108 base layer and for the discontinuous metal layer 110 of the metal bilayer 108. The particular geometric arrangement and dimensions of the metal blocks 114 and corresponding lateral gaps 'G' in the discontinuous metal layer 110 also may vary depending on the type of device and application, as can the respective thicknesses H1, H2 of the metal layers 110, 112 of the metal bilayer 108. The gaps 'G' between adjacent ones of the metal blocks 114 formed in the discontinuous metal layer 110 of the metal bilayer 108 may be filled or unfilled, as previously described herein.

Regarding the choice of materials for the continuous base metal layer 112 and the discontinuous metal layer 110 of the metal bilayer 108, both layers 110, 112 are metallic. In one embodiment, the continuous base metal layer 112 is any metal available for thicknesses between about 1 μm and 6 μm, e.g., such as Al, Cu or Au. The material of the discontinuous metal layer 110 may be suitable for electro-galvanic deposition (ECD), e.g., such as Cu or Au. The continuous base metal layer 112 may be deposited by PVD (physical vapor deposition) and then etched, or instead the continuous base metal layer 112 may be also be electro-deposited using a first pattern plating process, e.g., as shown in FIG. 7C. For a thickness ratio H1:H2>1, the discontinuous metal layer 110 is preferably electro-deposited as there is no reasonable other way of obtaining a narrow-gap structured thick metal layer.

Figure 10A:
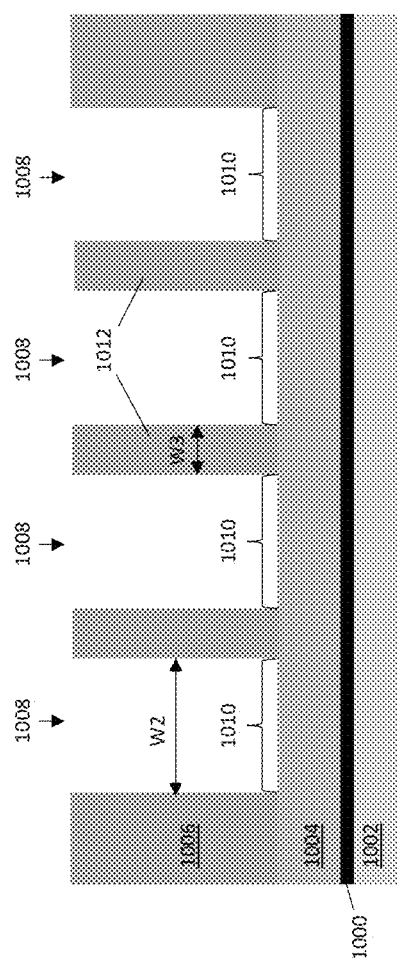
FIGS. 10A and 10B illustrate respective partial cross-sectional views during different stages of another embodiment of a method for producing the metal bilayer.
Figure 10B:
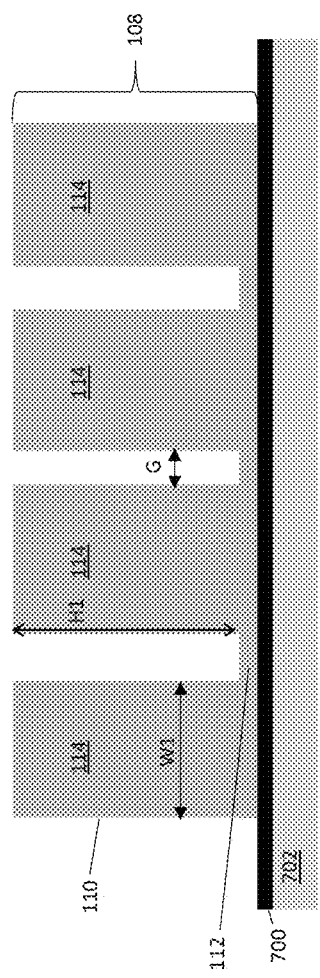

FIGS. 10A and 10B illustrate respective partial cross-sectional views during different stages of another embodiment of a method for producing the metal bilayer 108.

FIG. 10A shows a Cu diffusion barrier layer 1000 such as TiW formed on an ILD 1002 and a Cu seed layer 1004 formed on the Cu diffusion barrier layer 1000. According to this embodiment, the Cu seed layer 1004 is thick enough, e.g., 2 μm to 3 μm thick, to function as the continuous base metal layer 112 of the metal bilayer 108. In other words, the Cu seed layer 1004 is thick enough to ensure lateral heat spreading but as thin as possible to minimize edge/interface interactions. A mask 1006, such as a photoresist of the kind previously described herein in connection with FIGS. 7E-7F and/or FIG. 8, is formed on the Cu seed layer 1004. The mask 1006 has openings 1008 which expose parts 1010 of the Cu seed layer 1004. The width 'W2' of the openings 1008 in the mask 1006 defines the width W1 of the metal blocks 114 of the discontinuous metal layer 110 of the metal bilayer 108 to be formed in the openings 1008 in the mask 1006. The width/thickness 'W3' of the mask walls 1012 defines the size of the gap 'G' between the adjacent metal blocks 114 to be formed.

FIG. 10B shows the metal bilayer 108 after the discontinuous metal layer 110 of the metal bilayer 108 is formed on the exposed parts 1010 of the Cu seed layer 1004 and after the part of the Cu seed layer 1004 uncovered by the discontinuous metal layer 110 is removed to form the underlying continuous base metal layer 112 of the metal bilayer 108. The discontinuous metal layer 110 may be formed by an ECD process in which Cu is plated on the exposed parts 1010 of the Cu seed layer 1004 to form the metal blocks 114 of the discontinuous metal layer 110.

Similar to the embodiment illustrated in FIGS. 7A through 7G, the metal bilayer 108 is monolithically formed with etched structures and resulting in a continuous base layer 112 and a heat sink structure formed by metal blocks 114 in a discontinuous layer 110. Different, however, only a single mask 1006 and single ECD process are used to form the metal bilayer 108 since the continuous base metal layer 112 of the metal bilayer 108 is formed by the Cu seed layer 1004 instead of another Cu layer plated on the seed layer 1004. However, etching of the Cu seed layer 1004 to form the continuous base metal layer 112 of the metal bilayer 108 may widen the gap 'G' between adjacent metal blocks 114 of the discontinuous metal layer 110 and may reduce the thickness H1 of the discontinuous metal layer 110. If the metal bilayer 108 is the uppermost metallization layer of the semiconductor device, contact pads may be formed on or as part of the metal bilayer 108, e.g., as previously described herein in connection with FIG. 1. If, however, the metal bilayer 108 is an intermediary metal layer, one or more ILD layers and metal layers may be formed on the metal bilayer 108 to complete the device.

FIGS. 11A through 11G illustrate respective partial cross-sectional views during different stages of another embodiment of a method for producing the metal bilayer 108.

FIG. 11A shows a first Cu diffusion barrier layer 1100 such as TiW formed on an ILD 1102 and a Cu base layer 1104 formed on the first Cu diffusion barrier layer 1100. The Cu base layer 1104 is thick enough, e.g., 2 μm to 3 μm thick, to function as the continuous base metal layer 112 of the metal bilayer 108. In other words, the Cu base layer 1104 is thick enough to ensure lateral heat spreading but as thin as possible to minimize edge/interface interactions.

FIG. 11B shows a second Cu diffusion barrier layer 1106 such as TiW formed on the Cu base layer 1104 and a Cu seed layer 1108 formed on the second Cu diffusion barrier layer 1106.

FIG. 11C shows a first mask 1110 such as a photoresist formed on the Cu seed layer 1108. The first mask 1110 exposes a part 1112 of the Cu seed layer 1108.

FIG. 11D shows the exposed part 1112 of the Cu seed layer 1108 and the corresponding underlying part of the second Cu diffusion barrier layer 1106 removed to form a pedestal structure 1114 which includes the part 1108' of the Cu seed layer 1108 and the part 1106' of the underlying second Cu diffusion barrier layer 1106 protected by the first mask 1110. FIG. 11D also shows the first mask 1110 removed.

FIG. 11E shows a second mask 1116 such as a photoresist formed on the pedestal structure 1114 and on the Cu base layer 1104. The second mask 1116 has openings 1118 which expose parts 1120 of the pedestal structure 1114. The width 'W2' of the openings 1118 in the second mask 1116 defines the width W1 of the metal blocks 114 of the discontinuous metal layer 110 of the metal bilayer 108 to be formed in the openings 1118 in the second mask 1116. The width/thickness 'W3' of the mask walls 1122 defines the size of the gap 'G' between the adjacent metal blocks 114 to be formed.

FIG. 11F shows the discontinuous metal layer 110 of the metal bilayer 108 formed on the exposed parts 1120 of the pedestal structure 1114, after the remaining part 1108' of the Cu seed layer 1108 is removed. According to this embodiment, the discontinuous metal layer 110 of the metal bilayer 108 is formed directly on the remaining part 1106' of the second Cu diffusion barrier layer 1106. The discontinuous metal layer 110 may be formed by an ECD process in which Cu is plated on the exposed remaining parts 1106'/1120 of the second Cu diffusion barrier layer to form the metal blocks 114 of the discontinuous metal layer 110.

FIG. 11G shows the outer part of the Cu base layer 1104 removed to form the continuous base metal layer 112 of the metal bilayer 108. According to this embodiment, the metal bilayer 108 includes the remaining parts 1100', 1106' of the first and second Cu diffusion barrier layers 1100, 1106, the continuous base metal layer 112 and the discontinuous metal layer 110. The continuous base metal layer 112 and the discontinuous metal layer 110 are separated from one another by the remaining part 1106' of the second Cu diffusion barrier layer 1106.

According to the embodiment illustrated in FIGS. 11A through 11G, the continuous base metal layer 112 of the metal bilayer 108 is twice encapsulated by upper and lower Cu diffusion barrier layers 1100', 1106' which protect the continuous base metal layer 112 from compressive stress by acting as stress concentration points. If the metal bilayer 108 is the uppermost metallization layer of the semiconductor device, contact pads may be formed on or as part of the metal bilayer 108, e.g., as previously described herein in connection with FIG. 1. If, however, the metal bilayer 108 is an intermediary metal layer, one or more ILD layers and metal layers may be formed on the metal bilayer 108 to complete the device. As was the case with the embodiment illustrated in FIGS. 10A and 10B, etching of the Cu base layer 1104 to form the continuous base metal layer 112 of the metal bilayer 108 may widen the gap 'G' between adjacent metal blocks 114 of the discontinuous metal layer 110 and may reduce the thickness H1 of the discontinuous metal layer 110.

FIGS. 12A through 12F illustrate respective partial cross-sectional views during different stages of another embodiment of a method for producing the metal bilayer 108.

Figure 12D:
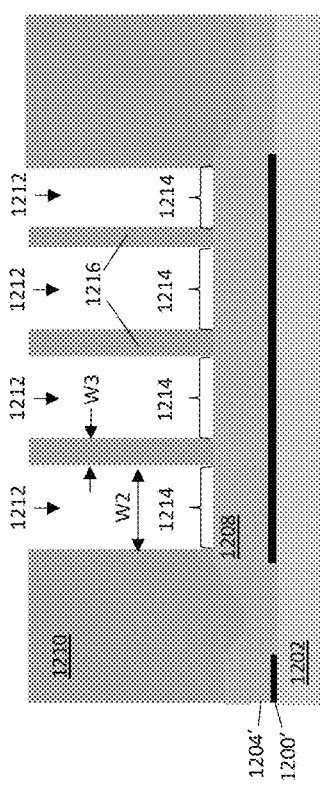
FIGS. 12A through 12F illustrate respective partial cross-sectional views during different stages of another embodiment of a method for producing the metal bilayer.
Figure 12E:
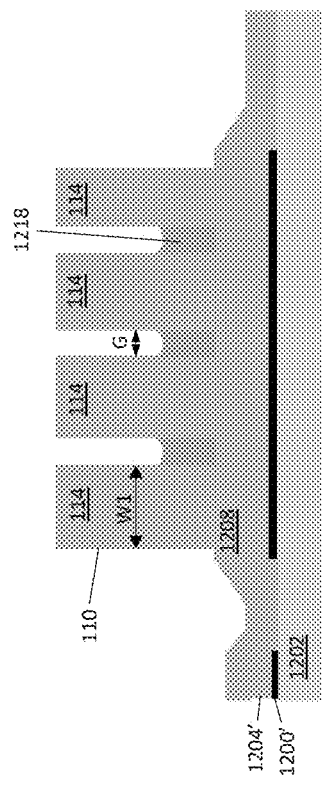
Figure 12E:
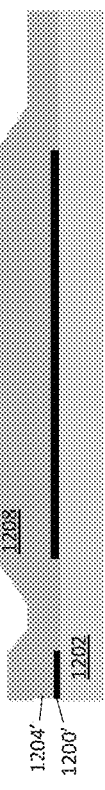
Figure 12F:
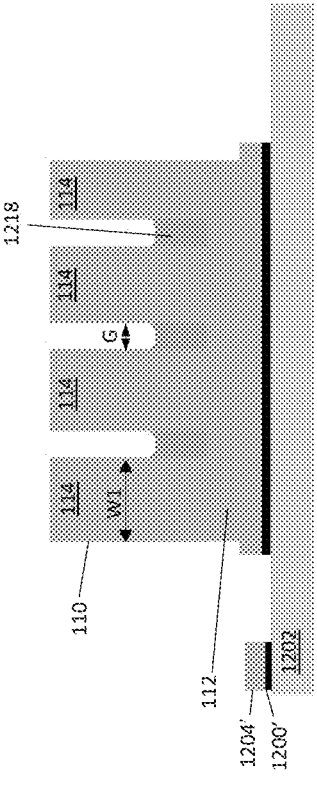
Figure 12A:
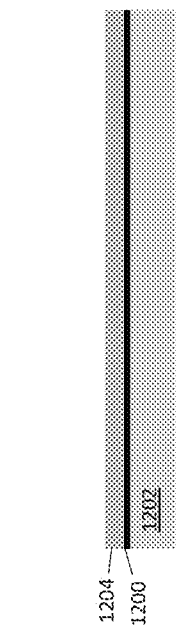

FIG. 12A shows a Cu diffusion barrier layer 1200 such as TiW formed on an ILD 1202 and a thin Al (aluminium) layer 1204, e.g., about 500 nm (nano meters) thick, formed on the Cu diffusion barrier layer 1200.

Figure 12B:
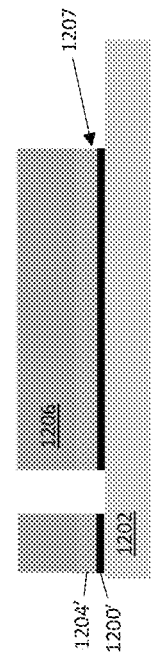

FIG. 12B shows a first mask 1206 such as a photoresist formed on the thin Al layer 1204. Exposed parts of the thin Al layer 1204 and of the corresponding underlying Cu diffusion barrier layer 1200 unprotected by the first mask 1206 are removed to form at least one island region 1207. Each island 1207 is formed by a remaining part 1204' of the thin Al layer 1204 and a remaining part 1200' of the Cu diffusion barrier layer 1200.

Figure 12C:
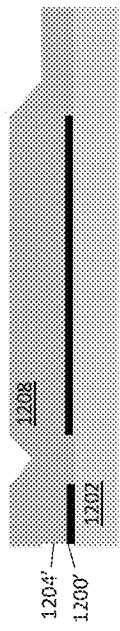

FIG. 12C shows a Cu seed layer 1208 covering each island 1207 and the exposed part of the ILD 1202. The Cu seed layer 1208 is thick enough, e.g., 2 μm to 3 μm thick, to function as the continuous base metal layer 112 of the metal bilayer 108. In other words, the Cu seed layer 1208 is thick enough to ensure lateral heat spreading but as thin as possible to minimize edge/interface interactions.

The Al layer 1204 may instead be formed before the Cu diffusion barrier layer 1200. In this case, the Cu diffusion barrier layer 1200 is formed after patterning of the islands 1207 as shown in FIG. 12B and before deposition of the Cu seed layer 1208 as shown in FIG. 12C. According to this embodiment, the Al layer 1204 may be thicker than what was described above in connection with FIG. 12A. For example, the Al layer 1204 may be 2000 nm of thicker.

FIG. 12D shows a second mask 1210 such as a photoresist formed on the Cu seed layer 1208. The second mask 1210 has openings 1212 which expose parts 1214 of the underlying Cu seed layer 1208. The width 'W2' of the openings 1212 in the second mask 1210 defines the width W1 of the metal blocks 114 of the discontinuous metal layer 110 of the metal bilayer 108 to be formed in the openings 1212 in the second mask 1210. The width/thickness 'W3' of the mask walls 1216 defines the size of the gap 'G' between the adjacent metal blocks 114 to be formed.

FIG. 12E shows the discontinuous metal layer 110 of the metal bilayer 108 formed on the exposed parts 1214 of the Cu seed layer 1208. The discontinuous metal layer 110 may be formed by an ECD process in which Cu is plated on the exposed parts 1214 of the Cu seed layer 1208 to form the metal blocks 114 of the discontinuous metal layer 110. Residual 1218 of the second mask 1210 may remain in the later gap 'G' between the metal blocks 114.

FIG. 12F shows the outer part of the Cu seed layer 1208 removed to form the continuous base metal layer 112 of the metal bilayer 108. According to this embodiment, the metal bilayer 108 includes the remaining parts 1200', 1204' of the Cu diffusion barrier layer 1200 and the thin Al layer 1204, the continuous base metal layer 112 and the discontinuous metal layer 110. The continuous base metal layer 112 and the discontinuous metal layer 110 are separated from one another by the remaining parts 1200', 1204' of the Cu diffusion barrier layer 1200 and the thin Al layer 1204. If the metal bilayer 108 is the uppermost metallization layer of the semiconductor device, contact pads may be formed on or as part of the metal bilayer 108, e.g., as previously described herein in connection with FIG. 1. If, however, the metal bilayer 108 is an intermediary metal layer, one or more ILD layers and metal layers may be formed on the metal bilayer 108 to complete the device.

Although the present disclosure is not so limited, the following numbered examples demonstrate one or more aspects of the disclosure.

Example 1. A semiconductor device, comprising: a semiconductor substrate; a power device formed in the semiconductor substrate; a metal bilayer formed over the semiconductor substrate, the metal bilayer comprising a discontinuous metal layer formed on and in contact with a continuous base metal layer; and one or more contact pads formed in the metal bilayer or in a metallization layer above the metal bilayer, wherein the discontinuous metal layer comprises a plurality of metal blocks which are laterally spaced apart from one another and which form a heat sink structure over the power device, wherein the continuous base metal layer is configured to laterally spread heat energy from the power device to the plurality of metal blocks.

Example 2. The semiconductor device of example 1, wherein a thickness of the discontinuous metal layer is greater than a thickness of the continuous base metal layer or the thickness of the discontinuous metal layer is at least 10 times the thickness of the continuous base metal layer, and wherein the plurality of metal blocks each have a width greater than the thickness of the discontinuous metal layer.

Example 3. The semiconductor device of examples 1 or 2, wherein the plurality of metal blocks is arranged in a honeycomb pattern.

Example 4. The semiconductor device of any of examples 1 through 3, wherein the discontinuous metal layer comprises copper and has a thickness greater than 10 μm, wherein the continuous base metal layer comprises copper and has a thickness less than 10 μm, and wherein the plurality of metal blocks each have a width greater than the thickness of the discontinuous metal layer.

Example 5. The semiconductor device of any of examples 1 through 4, wherein a gap between adjacent metal blocks of the plurality of metal blocks is less than both a width of the plurality of metal blocks and a thickness of the discontinuous metal layer.

Example 6. The semiconductor device of example 5, wherein the gap between the adjacent metal blocks is less than one third (%) the width of the plurality of metal blocks and less than one half (%) the thickness of the discontinuous metal layer.

Example 7. The semiconductor device of example 5, wherein the gap between the adjacent metal blocks is less than one quarter (') the width of the plurality of metal blocks.

Example 8. The semiconductor device of any of examples 1 through 7, wherein the discontinuous metal layer has a thickness greater than 20 μm, wherein the continuous base metal layer has a thickness in a range of 1 μm to 6 μm, wherein the plurality of metal blocks each have a width in a range of 30 μm to 60 μm, and wherein a gap between adjacent metal blocks of the plurality of metal blocks is in a range of 1 μm to 10 μm.

Example 9. The semiconductor device of any of examples 1 through 8, wherein the metal bilayer is an uppermost metallization layer of the semiconductor device, wherein the one or more contact pads are formed in the metal bilayer, and wherein a gap between adjacent metal blocks of the plurality of metal blocks is filled with molding compound, imide, spin on glass, or paraffin.

Example 10. The semiconductor device of example 1, wherein a ratio of a thickness of the discontinuous metal layer to a thickness of the continuous base metal layer is in a range of 1:2 to 50:1.

Example 11. A semiconductor device, comprising: a semiconductor substrate; and a metal bilayer separated from the semiconductor substrate by at least one interlayer dielectric, wherein the metal bilayer comprises a discontinuous metal layer on a continuous base metal layer, wherein the continuous base metal layer has a thickness which is at most 20% of an overall thickness of the metal bilayer, wherein the discontinuous metal layer has a thickness which is at least 50% of the overall thickness of the metal bilayer, wherein the discontinuous metal layer comprises a plurality of metal blocks which are laterally spaced apart from one another and in contact with the continuous base metal layer, wherein the plurality of metal blocks each have a width greater than the thickness of the discontinuous metal layer, wherein a gap between adjacent metal blocks of the plurality of metal blocks is less than both the width of the plurality of metal blocks and the thickness of the discontinuous metal layer.

Example 12. The semiconductor device of example 11, wherein the plurality of metal blocks is arranged in a honeycomb pattern.

Example 13. The semiconductor device of example 11 or 12, wherein the gap between the adjacent metal blocks is less than one third (%) the width of the plurality of metal blocks and less than one half (%) the thickness of the discontinuous metal layer, or wherein the gap between the adjacent metal blocks is less than one quarter (') the width of the plurality of metal blocks.

Example 14. The semiconductor device of any of examples 11 through 13, wherein the metal bilayer is an uppermost metallization layer of the semiconductor device, and wherein the gap between the adjacent metal blocks is filled with molding compound, imide, spin on glass, or paraffin.

Example 15. A method of producing a semiconductor device, the method comprising: forming a metal bilayer over a semiconductor wafer; and forming one or more contact pads in the metal bilayer or in a metallization layer above the metal bilayer, wherein forming the metal bilayer comprises: forming a continuous base metal layer over an interlayer dielectric; forming a first patterned photoresist on the continuous base metal layer, the first patterned photoresist having a plurality of openings separated from one another by respective walls; and filling the plurality of openings in the first patterned photoresist with metal or a metal alloy to form a discontinuous metal layer which is in contact with the continuous base metal layer and comprises a plurality of metal blocks laterally spaced apart from one another by the walls of the first patterned photoresist.

Example 16. The method of example 15, wherein forming the continuous base metal layer over the interlayer dielectric comprises: forming a copper barrier layer on the interlayer dielectric; and forming a copper seed layer on the barrier layer, wherein filling the plurality of openings in the first patterned photoresist with metal or a metal alloy to form the discontinuous metal layer comprises: electrochemically depositing copper on regions of the continuous base metal layer exposed by the plurality of openings in the first patterned photoresist.

Example 17. The method of example 15, wherein forming the continuous base metal layer over the interlayer dielectric comprises: forming a first copper barrier layer on the interlayer dielectric; forming a first copper seed layer on the first barrier layer; forming a second copper barrier layer on the first copper seed layer; forming a second copper seed layer on the second barrier layer; and patterning the second copper seed layer and the second barrier layer to form a raised area, wherein filling the plurality of openings in the first patterned photoresist with metal or a metal alloy to form the discontinuous metal layer comprises: electrochemically depositing copper on regions of the raised area of the continuous base metal layer exposed by the plurality of openings in the first patterned photoresist.

Example 18. The method of example 15, wherein forming the continuous base metal layer over the interlayer dielectric comprises: forming an aluminum layer over the interlayer dielectric; patterning the aluminum layer to form an island region; and forming a copper seed layer over the island region, wherein filling the plurality of openings in the first patterned photoresist with metal or a metal alloy to form the discontinuous metal layer comprises: electrochemically depositing copper on regions of the copper seed layer exposed by the plurality of openings in the first patterned photoresist.

Example 19. The method of any of examples 15 through 18, wherein forming the first patterned photoresist on the continuous base metal layer comprises: forming a photosensitive chemical photoresist on the continuous base metal layer; and transferring a geometric pattern from a photomask to the photosensitive chemical photoresist, the geometric pattern defining the plurality of openings and the walls in the photosensitive chemical photoresist.

Example 20. The method of any of examples 15 through 19, wherein the geometric pattern yields physical connections between the walls such that the plurality of openings in the photosensitive chemical photoresist are defined on all sides by the walls and the walls support one another during the filling of the plurality of openings with metal or a metal alloy.

Example 21. The method of example 20, wherein the photosensitive chemical photoresist is a cross-linking negative resist, and wherein an aspect ratio of wall height to wall width is greater than 1 for the walls formed in the photosensitive chemical photoresist.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate;
a power device formed in the semiconductor substrate;
a metal bilayer formed over the semiconductor substrate, the metal bilayer comprising a discontinuous metal layer formed on and in contact with a continuous base metal layer; and
one or more contact pads formed in the metal bilayer or in a metallization layer above the metal bilayer,
wherein the discontinuous metal layer comprises a plurality of metal blocks which are laterally spaced apart from one another and which form a heat sink structure over the power device,
wherein the continuous base metal layer is configured to laterally spread heat energy from the power device to the plurality of metal blocks,
wherein the metal bilayer is an uppermost metallization layer of the semiconductor device or a metallization layer below the uppermost metallization layer.

2. The semiconductor device of claim 1, wherein a thickness of the discontinuous metal layer is greater than a thickness of the continuous base metal layer or the thickness of the discontinuous metal layer is at least 10 times the thickness of the continuous base metal layer, and wherein the plurality of metal blocks each have a width greater than the thickness of the discontinuous metal layer.

3. The semiconductor device of claim 1, wherein the plurality of metal blocks is arranged in a honeycomb pattern.

4. The semiconductor device of claim 1, wherein the discontinuous metal layer comprises copper and has a thickness greater than 10 µm, wherein the continuous base metal layer comprises copper and has a thickness less than 10 µm, and wherein the plurality of metal blocks each have a width greater than the thickness of the discontinuous metal layer.

5. The semiconductor device of claim 1, wherein a gap between adjacent metal blocks of the plurality of metal blocks is less than both a width of the plurality of metal blocks and a thickness of the discontinuous metal layer.

6. The semiconductor device of claim 5, wherein the gap between the adjacent metal blocks is less than one third (⅓) the width of the plurality of metal blocks and less than one half (½) the thickness of the discontinuous metal layer.

7. The semiconductor device of claim 5, wherein the gap between the adjacent metal blocks is less than one quarter (¼) the width of the plurality of metal blocks.

8. The semiconductor device of claim 1, wherein a ratio of a thickness of the discontinuous metal layer to a thickness of the continuous base metal layer is in a range of 1:2 to 50:1.

9. The semiconductor device of claim 1, wherein the metal bilayer is the uppermost metallization layer, wherein the one or more contact pads are formed in the metal bilayer, and wherein a gap between adjacent metal blocks of the plurality of metal blocks is filled with molding compound, imide, spin on glass, or paraffin.

10. A semiconductor device, comprising:
a semiconductor substrate; and
a metal bilayer separated from the semiconductor substrate by at least one interlayer dielectric, the metal bilayer comprising a discontinuous metal layer on a continuous base metal layer,
wherein the continuous base metal layer has a thickness which is at most 20% of an overall thickness of the metal bilayer, wherein the discontinuous metal layer has a thickness which is at least 50% of the overall thickness of the metal bilayer, wherein the discontinuous metal layer comprises a plurality of metal blocks which are laterally spaced apart from one another and in physical contact with the continuous base metal layer, wherein the plurality of metal blocks each have a width greater than the thickness of the discontinuous metal layer, wherein a gap between adjacent metal blocks of the plurality of metal blocks is less than both the width of the plurality of metal blocks and the thickness of the discontinuous metal layer.

11. The semiconductor device of claim 10, wherein the plurality of metal blocks is arranged in a honeycomb pattern.

12. The semiconductor device of claim 10, wherein the gap between the adjacent metal blocks is less than one third (⅓) the width of the plurality of metal blocks and less than one half (½) the thickness of the discontinuous metal layer, or wherein the gap between the adjacent metal blocks is less than one quarter (¼) the width of the plurality of metal blocks.

13. The semiconductor device of claim 10, wherein the metal bilayer is an uppermost metallization layer of the semiconductor device, and wherein the gap between the adjacent metal blocks is filled with molding compound, imide, spin on glass, or paraffin.

\* \* \* \* \*